(12) United States Patent  (10) Patent No.: US 7,409,618 B2
Romero et al.  (45) Date of Patent: Aug. 5, 2008

(54) SELF VERIFYING COMMUNICATIONS TESTING

(75) Inventors: Gabriel Romero, Colorado Springs, CO (US); Coralyn Gauvin, Colorado Springs, CO (US)

(73) Assignee: LSI Corporation, Milpitas, CA (US)

( * ) Notice: Subject to any disclaimer, the term of this patent is extended or adjusted under 35 U.S.C. 154(b) by 311 days.

(21) Appl. No.: 10/959,619

(22) Filed: Oct. 6, 2004

(65) Prior Publication Data

US 2006/0075318 A1  Apr. 6, 2006

(51) Int. Cl.
*G01R 31/28* (2006.01)
(52) U.S. Cl. .......................................... 714/738
(58) Field of Classification Search ................ 714/738, 714/37, 39, 48, 712, 715, 716, 799, 819, 714/30, 733, 734
See application file for complete search history.

(56) References Cited

U.S. PATENT DOCUMENTS 5,663,967 A * 9/1997 Lindberg et al. ............. 714/737
6,961,317 B2 * 11/2005 Abramovitch et al. ....... 370/252
6,993,696 B1 * 1/2006 Tanizaki et al. .............. 714/744
7,127,648 B2 * 10/2006 Jiang et al. ................... 714/715

* cited by examiner

*Primary Examiner*—Phung M Chung
(74) *Attorney, Agent, or Firm*—Krajec Patent Offices, LLC

(57) ABSTRACT

A system and method for testing a device with multiple interfaces by generating a predetermined data pattern within the device, transmitting the pattern to a test analyzer, generating a second predetermined data pattern within the test analyzer, and simultaneously transmitting the second test pattern to the device where the second test pattern is verified. The first and second test patterns may be the same or different, depending on the application. Further, the transmit and receive paths may be tested separately and independently in addition to simultaneously.

20 Claims, 5 Drawing Sheets

SELF VERIFYING COMMUNICATIONS TESTING

BACKGROUND OF THE INVENTION a. Field of the Invention

The present invention pertains generally to electronic devices having communication interfaces and specifically to testing and verification of communication interfaces.

b. Description of the Background

High speed communications interfaces are commonplace in today's computers. Ever increasing data rates make testing and verifying the communications interfaces increasingly difficult. Often, very expensive and costly test equipment is required to perform various tests needed to debug the interface as well as certify compliance with interoperability standards.

A common method for testing is to configure the device under test (DUT) with an internal loopback. The loopback may take data received on one port and relay the data out another port. Generally, the DUT performs little or no processing of the data during the test. A piece of expensive test equipment can be used to generate the data stream that is sent to the DUT, then analyze the returned data stream to check if the data were transmitted without error.

When errors are detected using the loopback method, it is impossible to detect whether the errors occurred on the receive side or transmit side of the DUT. The design engineer or technician often has a very difficult time isolating the problem.

Further, the transmit and receive channels of the DUT cannot be tested independently. In some cases, the various channels may have different performance standards to maintain, which is impossible to fully exercise when one channel has a lower performance capability than another.

It would therefore be advantageous to provide a system and method to test a device having multiple communication channels simultaneously yet being able to determine if errors occurred in a transmit channel or receive channel. It would be further advantageous if such a system further enabled testing of transmit and receive channels separately.

SUMMARY OF THE INVENTION

The present invention overcomes the disadvantages and limitations of previous solutions by providing a system and method for testing a device with multiple interfaces by generating a predetermined data pattern within the device, transmitting the pattern to a test analyzer, generating a second predetermined data pattern within the test analyzer, and simultaneously transmitting the second test pattern to the device where the second test pattern is verified. The first and second test patterns may be the same or different, depending on the application. Further, the transmit and receive paths may be tested separately and independently in addition to simultaneously.

An embodiment of the present invention may include a system comprising: a device under test comprising: a transmit interface; a receive interface; a data pattern generator adapted to create a first predetermined data pattern and send the first predetermined data pattern to the transmit interface; and a pattern checker adapted to receive a second predetermined data pattern from the receive interface and verify the second predetermined data pattern; and an interface tester connected to the transmit interface and the receive interface and adapted to receive and analyze the first predetermined data pattern and further adapted to generate and send the second predetermined data pattern.

Another embodiment of the present invention may include a device under test comprising: a transmit interface; a receive interface; a data pattern generator adapted to create a first predetermined data pattern and send the first predetermined data pattern to the transmit interface; and a pattern checker adapted to receive a second predetermined data pattern from the receive interface and verify the second predetermined data pattern; wherein the device under test is comprised within a single chip.

Yet another embodiment of the present invention may include a method comprising: generating a first predetermined data pattern on a device under test; transmitting the first predetermined data pattern from the device under test to a test analyzer in a first data stream; using the test analyzer, analyze the first data stream to verify the first data stream and to create a second predetermined data pattern; transmitting the second predetermined data pattern from the test analyzer to the device under test in a second data stream; and using the device under test, analyze the second data stream.

The advantages of the present invention include that tests can be simultaneously performed on transmit and receive interfaces while being able to isolate any errors to one channel or the other. Various qualification and verification tests, as well as field checks of the interface are possible.

DETAILED DESCRIPTION OF THE INVENTION

Figure 1:
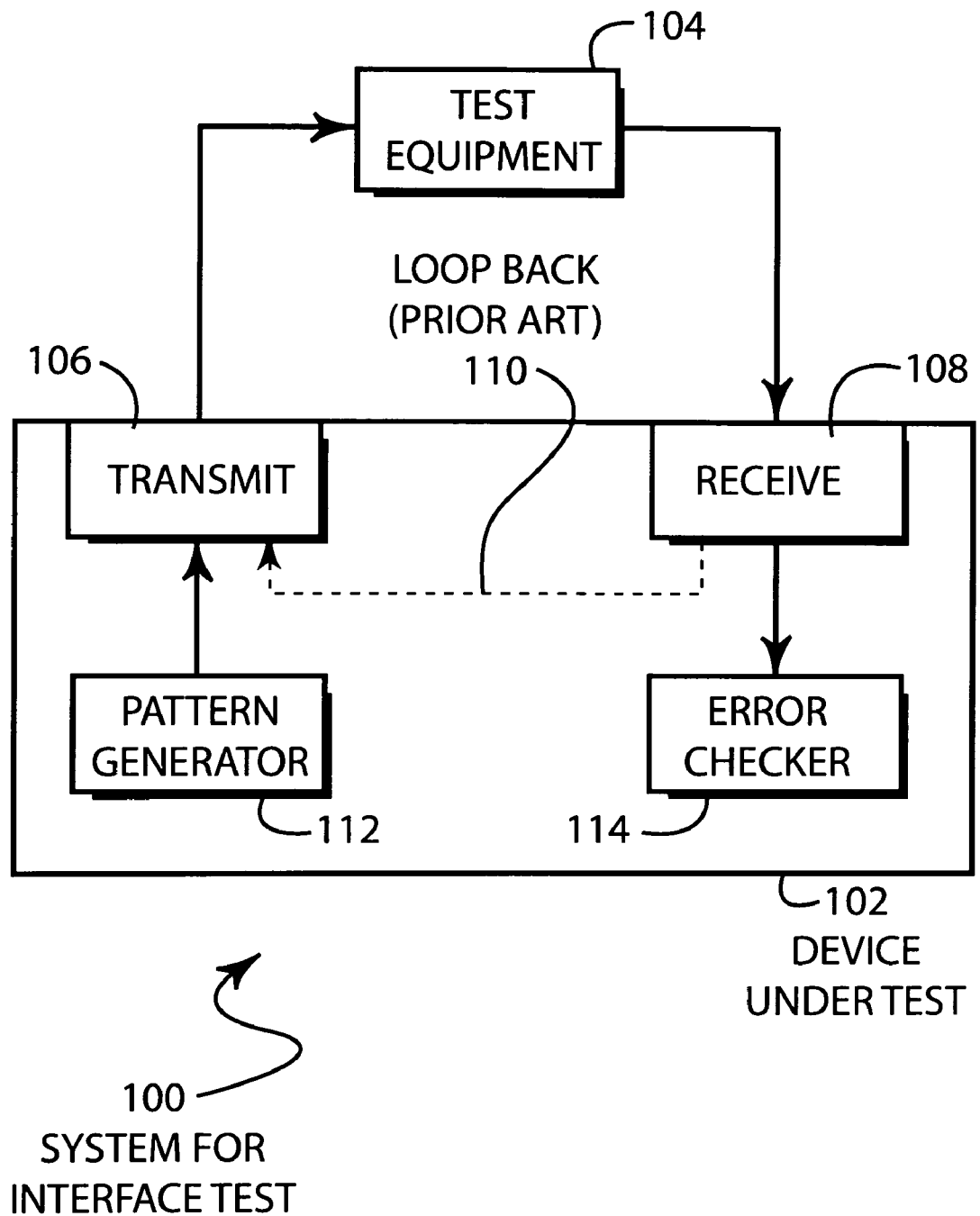
FIG. 1 is a diagrammatic illustration of an embodiment showing a system for interface testing.

While the invention is susceptible to various modifications and alternative forms, specific embodiments thereof are shown by way of example in the drawings and will be described in detail herein. It should be understood, however, that there is no intent to limit the invention to the particular forms disclosed, but on the contrary, the invention is to cover all modifications, equivalents, and alternatives falling within the spirit and scope of the invention as defined by the claims. Like reference numbers signify the elements throughout the description of the figures. It will also be understood that when an element is referred to as being "connected" or "coupled" to another element, it can be directly connected or coupled to the other element or intervening elements may also be present. In contrast, when an element is referred to as being "directly connected" or "directly coupled" to another element, there are no intervening elements present.

The present invention may be embodied as devices, systems, methods, and/or computer program products. Accordingly, the present invention may be embodied in hardware and/or in software (including firmware, resident software, micro-code, etc.) Furthermore, the present invention may take the form of a computer program product on a computer-usable or computer-readable storage medium having computer-usable or computer-readable program code embodied in the medium for use by or in connection with an instruction execution system. In the context of this document, a computer-usable or computer-readable medium may be any medium that can contain, store, communicate, propagate, or transport the program for use by or in connection with the instruction execution system, apparatus, or device.

The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a random access memory (RAM), an erasable programmable read-only memory (EPROM or Flash memory), an optical fiber, a portable compact disc read only memory (CD-ROM), and a digital video disk read only memory (DVD-ROM). Note that the computer-usable or computer-readable medium could even be paper or another suitable medium upon which the program is printed, as the program can be electronically captured, via, for instance, optical scanning of the paper or other medium, then compiled, interpreted, of otherwise processed in a suitable manner, if necessary, and then stored in a computer memory.

FIG. 1 illustrates an embodiment 100 of the present invention showing a system for performing interface tests. The device under test (DUT) 102 is connected to test equipment 104. The DUT 102 has a transmit port 106 and a receive port 108. The DUT 102 also contains a loopback path 110, a pattern generator 112 connected to the transmit port 106 and an error checker 114 connected to the receive port 108.

The embodiment 100 can perform an interface test on the transmit 106 and receive 108 ports simultaneously. A pattern may be generated within the DUT 102 by the pattern generator 112, transmitted through the transmit port 106, and analyzed by the test equipment 104. Additional data, sometimes comprising the same pattern transmitted to the test equipment 104, may be sent from the test equipment 104 through the receive port 108 and verified by the error checker 114.

In prior art embodiments, a pattern may be generated by the test equipment 104, sent to the DUT 102 and looped back using the loopback path 110. The data would complete the circuit and be analyzed by the test equipment 104. A distinct problem with such an embodiment is that if an error occurred, the engineer has no way of determining if the error occurred on the transmit side 106 or receive side 108 of the DUT 102.

By creating the data pattern at the DUT 102, analyzing the transmitted data stream with the test equipment 104, looping the data stream back through the receive port 108 and analyzing the received data stream with the error checker 114, an error may be located on either path separately. Such a system has a tremendous advantages to the testing engineer.

The DUT 102 may be any type of device having communication interfaces. For example, the DUT 102 may be a disk controller wherein one data port may be a backplane connector, such as PCI, connected to a computer motherboard and another port may be an interface to a disk drive. In such a case, the transmit port 106 and receive port 108 may use different communication protocols. For example, one port may be a parallel port, such as SCSI, while another one is serial. One port may be a specific type of serial port, such as Ethernet, while another one is FibreChannel. The ports 106 and 108 may be any type of electronic communication port.

In some embodiments, the DUT may be fully contained in a single package, such as a VLSI chip. In other embodiments, the DUT may be a single printed circuit board or multiple printed circuit boards.

The ports labeled transmit 106 and receive 108 may be single directional ports or may be bi-directional. For the purposes of this specification, the reference to transmit or receive is used to relate to the relative direction of data flow. With many communications protocols, bi-directional handshaking may be required of any port. However, when a bi-directional port, such as SCSI, FibreChannel, Ethernet, or any other protocol is tasked with sending a large amount of data from the DUT 102, it is labeled within this specification as a transmit port. Similarly, a receive port is one through which the DUT 102 receives a large amount of data.

In some embodiments, a port may be tested in primarily a transmit mode, then the test may be reversed so that the same port may be tested in primarily a receive mode. Each specific DUT 102 with specific port configurations may be tested differently, depending on the needs of the designer.

The test equipment 104 may consist of a data analyzer. The test equipment 104 may be programmable to analyze an incoming data stream of a predetermined pattern and compare the incoming data pattern with an expected data pattern. In some cases, the pattern may be an industry standard pattern. The pattern generated by the pattern generator 112 is generally a predetermined pattern expected to be received by the test equipment 104.

The test equipment 104 may have a loopback mode wherein the data pattern received from the transmit port 106 is analyzed and simultaneously looped back to the receive port 108. In some embodiments, the test equipment 104 may comprise a separate pattern generator that creates a new data pattern to send to the DUT 102.

The error checker 114 may be configured to expect a predetermined data pattern from the test equipment 104. The data pattern expected by the error checker 114 may be the same or a different data pattern as created by the pattern generator 112.

The data patterns transmitted from the DUT 102 to the test equipment 104 and back may be a repeating sequence of data bits or words. For example, a common data pattern is a repeating 01010101 pattern. In such an example, the byte 01010101 may be repeated for a specified period of time. Many other data patterns are commonly used for various purposes and are known in the art.

The data patterns generally have a predetermined pattern or sequence, since the data may be generated at the DUT 102 and analyzed at the test equipment 104. The pattern does not have to be repeating, but is generally predetermined.

In general, the types of tests that can be performed using the embodiment 100 include bit error rate tests, throughput tests, environmental tests, and other interface performance tests. Such tests sometimes involve extended testing for many minutes or hours. In such embodiments, the data patterns may be repeated. In some embodiments where a test occurs for a predetermined amount of time, the data pattern may not be repeated.

A bit error rate test may involve sending a repeated data pattern across an interface for many minutes or hours. Each data bit may be compared to an expected data bit to determine if any bits were incorrect. For example, this process may be repeated over and over until a certain number of errors occur or until a certain time limit is reached.

In some instances, the data transmitting over the transmit port 106 and received over the receive port 108 may be different speeds. In some embodiments, the speeds may be different due to slight differences in clock speeds of the DUT 102 and the test equipment 104, while in other embodiments, the speed differences may be due to grossly different port settings or port protocols.

Figure 2:
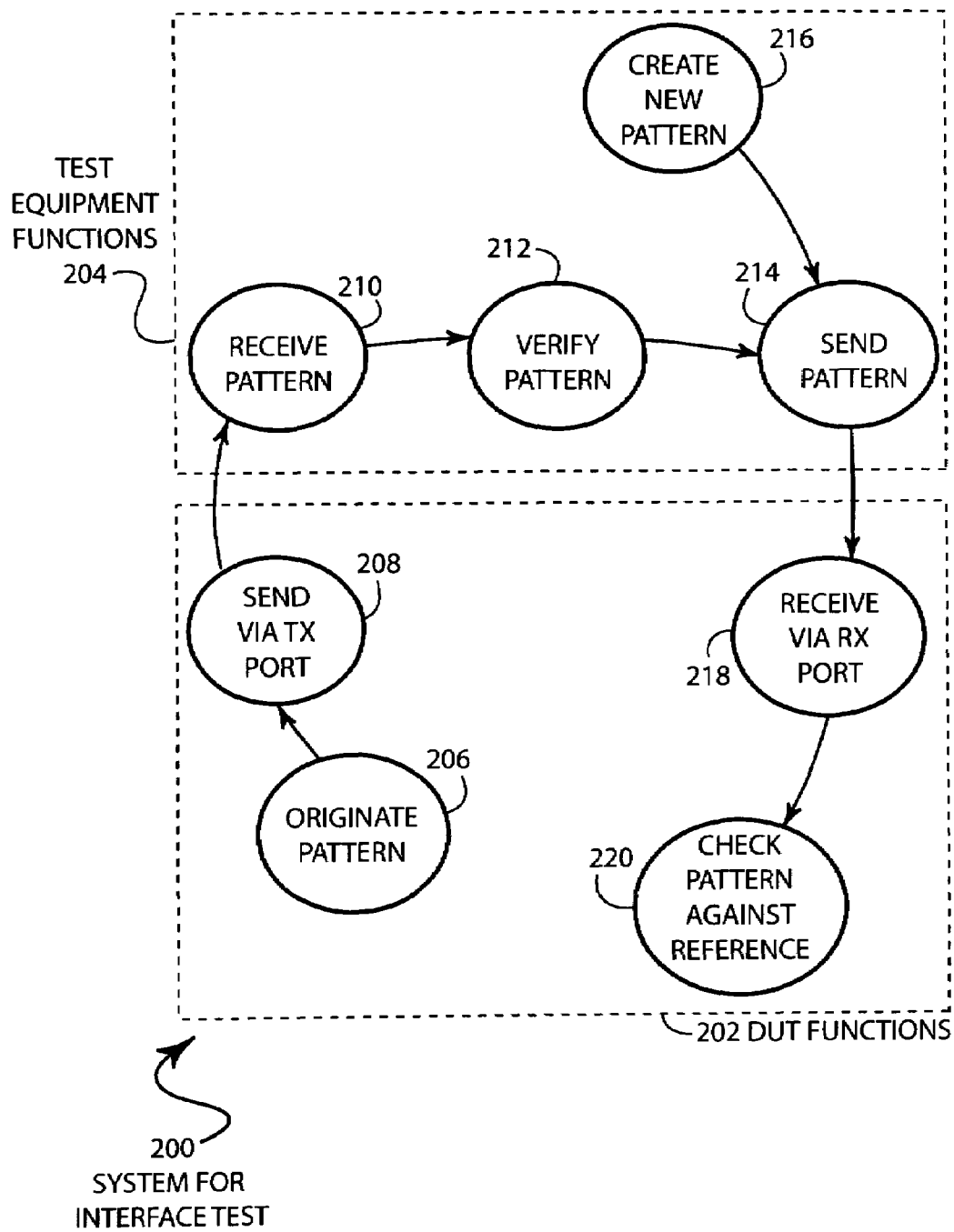
FIG. 2 is a workflow illustration of an embodiment showing the actions performed during a simultaneous interface test.

FIG. 2 illustrates an embodiment 200 of a system for interface testing. The device under test (DUT) functions 202 are shown separate from the test equipment functions 204.

With the DUT 202, the pattern originates 202 and is sent via the transmit port 208. The test equipment 204 receives the pattern 210 and verifies the pattern 212. In some cases, the verified pattern may be sent 214 to the DUT 202 to be received 218 and analyzed 220. In other cases, a new pattern may be created 216 and sent 214.

The communication along the transmit path and receive path can be separately checked and analyzed. For example, an error that occurs during the sending via the transmit port 208 and receiving 210 by the test equipment may be determined and recorded without effecting a simultaneous pattern test performed on the receive path of the DUT.

The test equipment 204 may be adapted to calculate the data throughput and error rates of the data transmitted from the DUT 202. In some embodiments, the DUT 202 may check the pattern against a reference in block 220, but may not have the ability to measure data throughput or take other measurements. In such an embodiment, the test equipment 204 may have the ability to measure the outgoing data throughput or other measurements as required.

Figure 3:
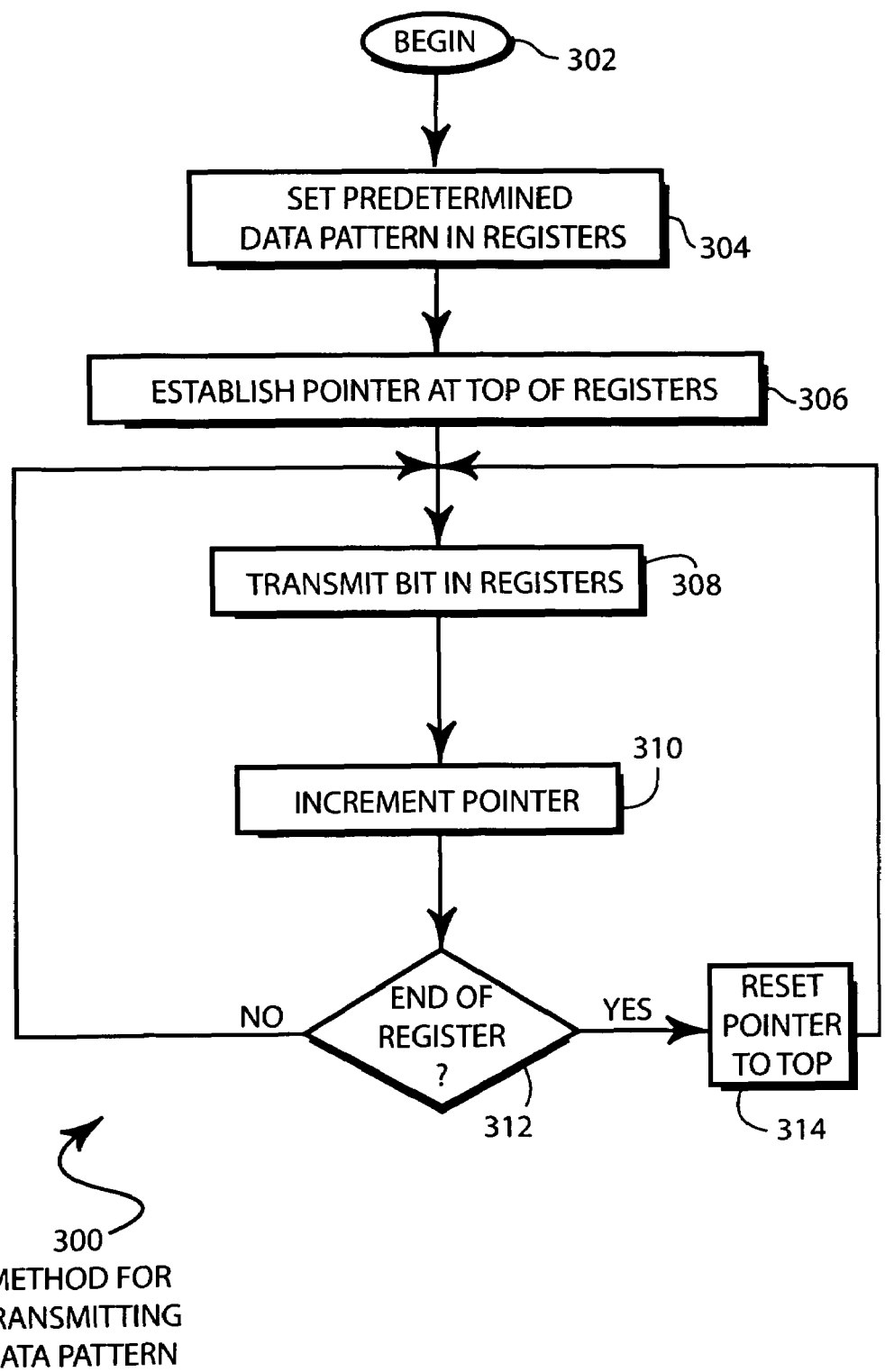
FIG. 3 is a flowchart illustration of an embodiment showing a method for transmitting a data pattern.
Figure 4:
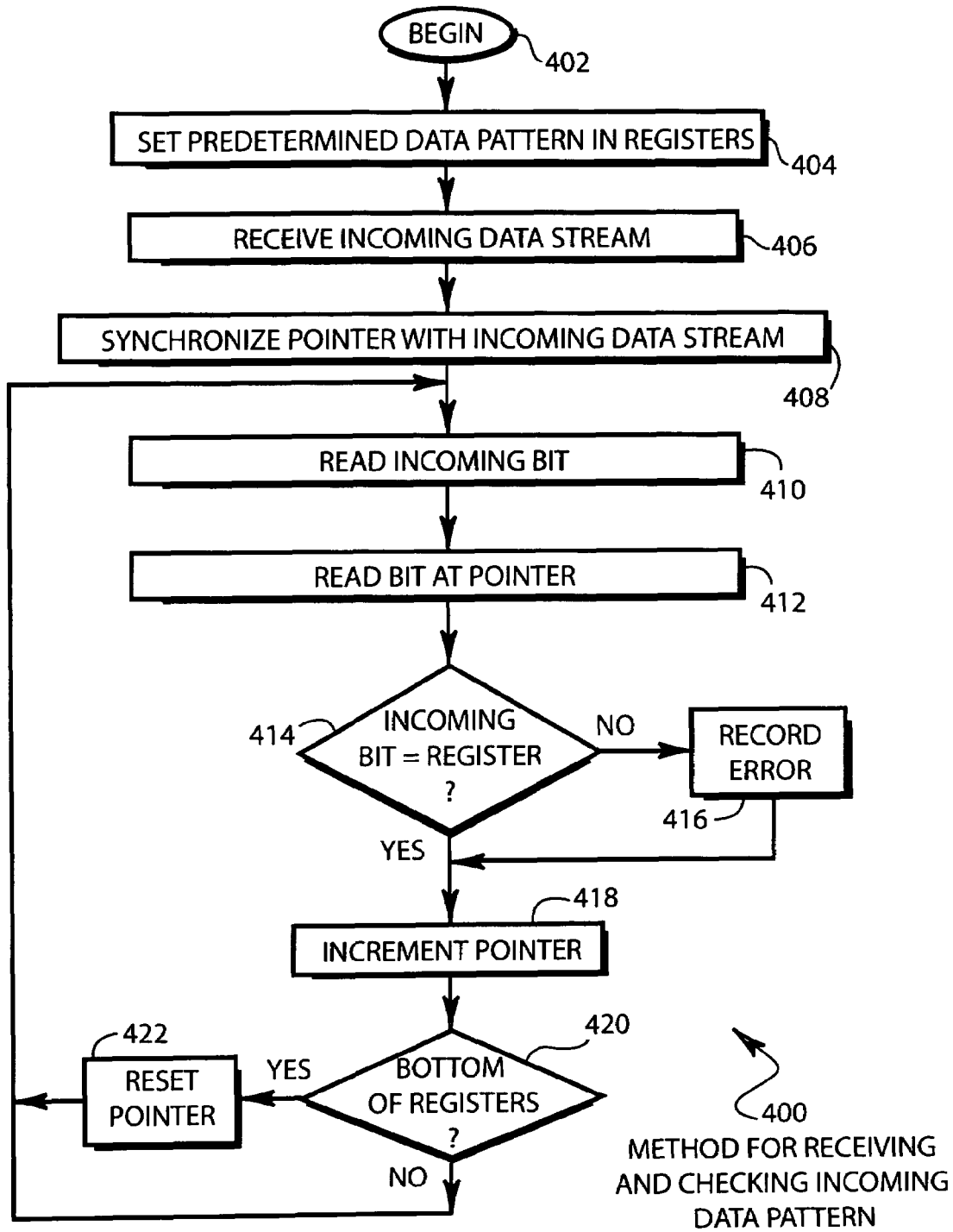
FIG. 4 is a flowchart illustration of an embodiment showing a method for receiving and checking an incoming data pattern.

In one embodiment, a set of registers may be set with a predetermined pattern for the transmitting data. A pointer may increment along the registers, reading the values which may then be transmitted. A similar technique may be used for checking the values of incoming data. FIGS. 3 and 4 describe such an embodiment.

FIG. 3 illustrates an embodiment 300 of a method for transmitting a repeating data pattern. The method begins in block 302. A predetermined data pattern is written into registers in block 304 and a pointer is established at the top of the registers 306. The register is read and the bit transmitted in block 308. The pointer is incremented in block 310. If the end of the register is reached in block 312, the pointer is reset to the top in bock 314 and the process continues in block 308. If the end of the register is not reached in block 312, the process continues in block 308.

The embodiment 300 illustrates one method whereby a set of registers and a pointer may be used in creating a repeating series of data bits. Such an embodiment may be implemented in various devices without consuming a large amount of programming space or specialized circuitry within the device. In some embodiments, the method 300 may be implemented in hardware, firmware, field programmable gate arrays, flash memory, random access memory, or any other implementation. For example, the predetermined pattern may be set in a series of connections made in hardware, stored in read only memory, or transmitted to the DUT and stored in random access memory prior to configuring the DUT for the test.

In some embodiments, the registers may contain bytes or words of data of any size. Such embodiments may be useful for testing parallel data interfaces as well as serial interfaces. Various embodiments may be implemented by those skilled in the arts while maintaining the spirit and intent of the present invention.

FIG. 4 illustrates an embodiment 400 of a method for receiving and checking an incoming data pattern. The method begins in block 402. A predetermined data pattern is loaded into registers in block 404. The incoming data stream is received in block 406 and the DUT synchronizes with the incoming data stream in block 408. An incoming bit is read in block 410 and the bit corresponding with a pointer is read in block 412. If the incoming bit does not equal the bit contained in the register in block 414, an error is recorded in block 416. The pointer is incremented in block 418. If the bottom of the register is reached in block 420, it is reset in block 422. The process continues with block 410.

Similar to the embodiment 300, a pointer may be used to keep track of the expected bits in keeping with the predetermined pattern. As bits are received, they are verified against the bits in the registers. When the pattern is completed, the pointer is reset and the process is repeated.

Various methods may be used for synchronizing the incoming data stream in block 408. In one embodiment, the pointer is set to a predetermined start position and the expected data is transmitted to correspond with the predetermined start position. In other embodiments, the data may be transmitting for a period of time and the data pattern may be analyzed to determine the appropriate location for the pointer. The specific implementation may vary depending on the type of data interface and the various parameters and characteristics of the interface.

In some embodiments, a synchronization phase may occur when the data is beginning to be transferred and the pointer is becoming synchronized. During such a phase, errors recorded in block 416 may be ignored until proper synchronization is achieved.

In such an embodiment during the synchronization phase, the process from block 410 through 422 may be followed except that in block 422, the pointer may be advanced one extra increment. As the pointer is advanced each time through the registers, the number of errors may be calculated. The position of the pointer where the number of errors is zero or a minimum may then be considered the synchronized position of the pointer.

After the pointer is synchronized, the number of errors recorded in block 416 may be discarded and various measured tests may begin.

As discussed for embodiment 300, the registers in embodiment 400 may be bytes or words of any length.

In some embodiments, the registers used for embodiment 300 for transmitting data may be the same registers used for embodiment 400 for receiving data. The pointers for each embodiment may be different, but refer to the same data pattern.

In other embodiments, the predetermined data pattern for the transmit side may be different from the predetermined data pattern for the receive side.

Figure 5:
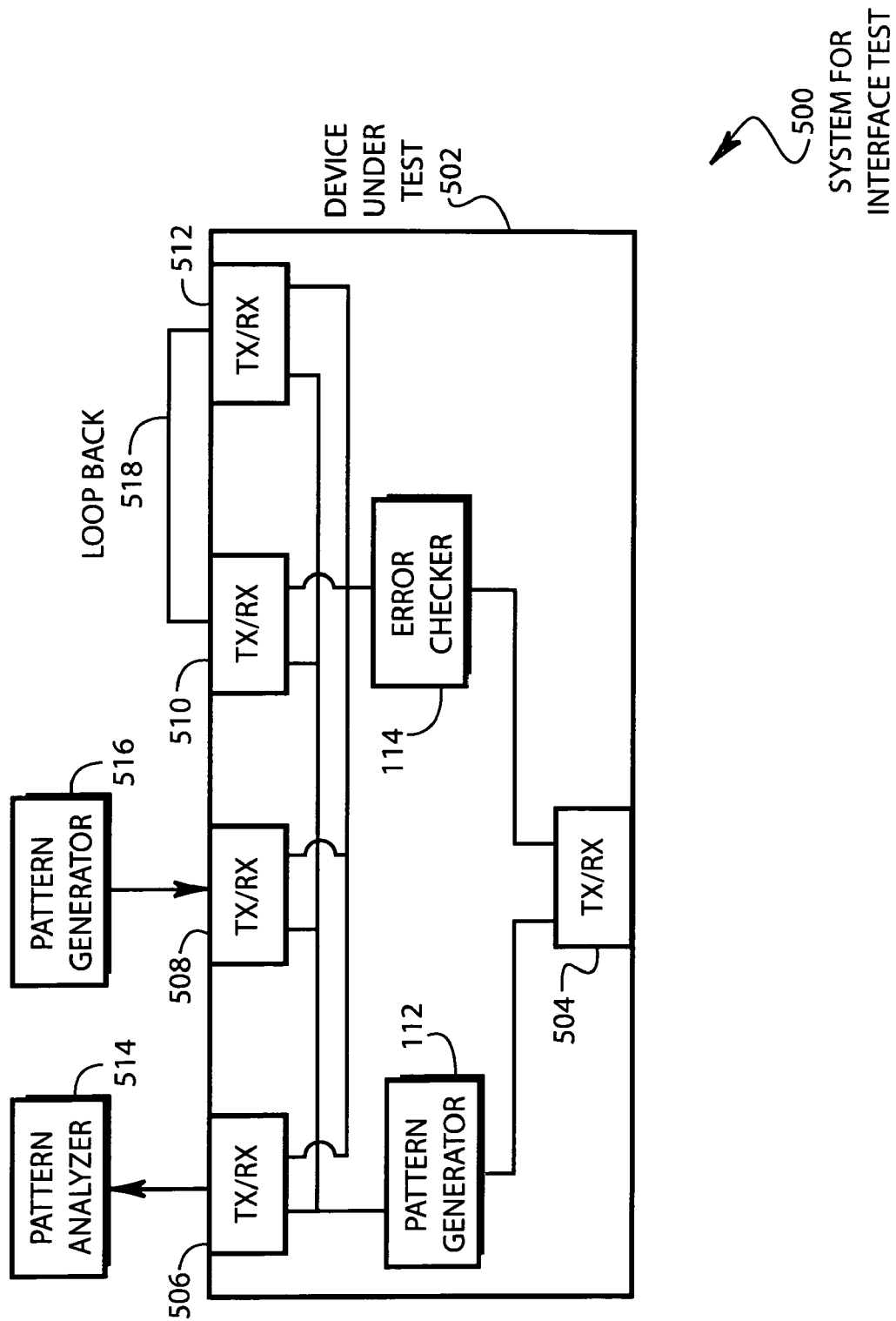
FIG. 5 is a diagrammatic illustration of an embodiment showing a device under test with several connections for testing.

FIG. 5 illustrates an embodiment 500 showing a system for interface tests with multiple test scenarios. The device under test (DUT) 502 has interface ports 504, 506, 508, 510, and 512, as well as pattern generator 112 and error checker 114. Port 506 is connected to pattern analyzer 514 and is configured to transmit a data stream. Port 508 is connected to pattern generator 516 and is configured to receive a data stream. Ports 510 and 512 are connected by an external loopback 518. Each port 504, 506, 508, 510, and 512 are connected to the pattern generator 112 and error checker 114.

Embodiment 500 illustrates several ways the internal pattern generator 112 and error checker 114 may be used to test an interface port's performance. Port 506 is being used in a transmit mode, transmitting the output of the pattern generator 112 to the pattern analyzer 514. Similarly, port 508 is being used in a receive mode, receiving the output of the pattern generator 516 and analyzing the data with the error checker 114.

Ports 510 and 512 are being used in a loopback mode, wherein the data from the pattern generator 112 is being transmitted out of one of the ports 510 and 512, received by the other port, and checked by the error checker 114. Such a mode may be useful for field checking of the performance of the system. The loopback 518 may be an external cable or other connection that enables the two ports 510 and 512 to communicate. While faults cannot be distinguished between transmit and receive sides, this configuration allows at least a cursory check of performance to be done without expensive test equipment. Such a test may be applicable to being performed in the field where test equipment is not available.

The DUT 502 may be configured such that the pattern generator 112 and the error checker 114 may be connected to some or all of the ports on the DUT 502. In some embodiments, the DUT 502 may have a limited amount of processing power such that only one or two ports may be tested simultaneously. In other embodiments, three, four, or more ports may be tested simultaneously in various configurations. Each embodiment may depend on the configurations of the DUT 502.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A system comprising:
    a device under test comprising:
        a transmit interface;
        a receive interface;
        a data pattern generator adapted to create a first predetermined data pattern and send said first predetermined data pattern to said transmit interface; and
        a pattern checker adapted to receive a second predetermined data pattern from said receive interface and verify said second predetermined data pattern; and
    an interface tester connected to said transmit interface and said receive interface and adapted to receive and analyze said first predetermined data pattern and further adapted to generate and send said second predetermined data pattern.

2. The system of claim 1 wherein said device under test is a single silicon chip.

3. The system of claim 1 wherein said device under test is a peripheral device for a computer system.

4. The system of claim 1 wherein said transmit interface is a serial interface.

5. The system of claim 1 wherein said transmit interface is a parallel interface.

6. The system of claim 1 wherein said first predetermined data pattern and said second predetermined data pattern are the same.

7. The system of claim 1 wherein said first predetermined data pattern and said second predetermined data pattern are transmitted simultaneously.

8. A device under test comprising:
    a transmit interface;
    a receive interface;
    a data pattern generator adapted to create a first predetermined data pattern and send said first predetermined data pattern to said transmit interface; and
    a pattern checker adapted to receive a second predetermined data pattern from said receive interface and verify said second predetermined data pattern;
    wherein said device under test is comprised within a single chip.

9. The device under test of claim 8 wherein said device under test is comprised within a peripheral device for a computer system.

10. The device under test of claim 8 wherein said transmit interface is a serial interface.

11. The device under test of claim 8 wherein said transmit interface is a parallel interface.

12. The device under test of claim 8 wherein said first predetermined data pattern and said second predetermined data pattern are the same.

13. The device under test of claim 8 wherein said first predetermined data pattern and said second predetermined data pattern are transmitted simultaneously.

14. A method comprising:
    generating a first predetermined data pattern on a device under test;
    transmitting said first predetermined data pattern from said device under test to a test analyzer in a first data stream;
    using said test analyzer, analyze said first data stream to verify said first data stream and to create a second predetermined data pattern;
    transmitting said second predetermined data pattern from said test analyzer to said device under test in a second data stream; and
    using said device under test, analyze said second data stream.

15. The method of claim 14 wherein said device under test is a single silicon chip.

16. The method of claim 14 wherein said device under test is a peripheral device for a computer system.

17. The method of claim 14 wherein said transmit interface is a serial interface.

18. The method of claim 14 wherein said transmit interface is a parallel interface.

19. The method of claim 14 wherein said first predetermined data pattern and said second predetermined data pattern are the same.

20. The method of claim 14 wherein said first predetermined data pattern and said second predetermined data pattern are transmitted simultaneously.

* * * * *